US006814659B2

(12) United States Patent
Cigelske, Jr.

(10) Patent No.: US 6,814,659 B2
(45) Date of Patent: Nov. 9, 2004

(54) LOUVER CONFIGURATION FOR WELDING APPARATUS

(75) Inventor: James J. Cigelske, Jr., Menasha, WI (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 10/065,582

(22) Filed: Oct. 31, 2002

(65) Prior Publication Data

US 2004/0087266 A1 May 6, 2004

(51) Int. Cl.[7] .................................................. H05K 5/00
(52) U.S. Cl. ........................ 454/184; 454/905; 454/277
(58) Field of Search ................................ 454/184, 275, 454/254, 905

(56) References Cited

U.S. PATENT DOCUMENTS 3,217,631 A * 11/1965 Thompson et al. ......... 454/309
3,662,670 A * 5/1972 McCoy ....................... 454/194
3,926,104 A * 12/1975 El Dorado ................... 454/65
3,996,845 A * 12/1976 Harris ........................ 454/320
4,141,285 A * 2/1979 Hendriksen .................. 454/63
4,163,650 A * 8/1979 Watson et al. ................. 96/57
4,661,669 A * 4/1987 Matsushima et al. ....... 219/757
4,665,466 A * 5/1987 Green ........................ 361/696
5,201,879 A * 4/1993 Steele ........................ 454/184
5,601,485 A * 2/1997 Gigola ....................... 454/277
5,642,260 A * 6/1997 Sigl ........................... 361/695
5,702,493 A * 12/1997 Everetts et al. ............... 55/356
5,730,652 A * 3/1998 Van Becelaere ............ 454/335
6,060,689 A * 5/2000 Wilson .................. 219/137.41
6,285,548 B1 * 9/2001 Hamlet et al. .............. 361/695
6,290,740 B1 * 9/2001 Schaefer .................... 55/385.2
6,311,445 B1 * 11/2001 Macander et al. ............ 52/473
6,458,274 B1 * 10/2002 Mori .......................... 210/222
6,489,591 B1 * 12/2002 Achtner ................... 219/130.1
6,494,780 B1 * 12/2002 Norbury, Jr. ................ 454/319
6,508,704 B1 * 1/2003 Wilson ....................... 454/277

* cited by examiner

*Primary Examiner*—Derek S. Boles
(74) *Attorney, Agent, or Firm*—Ziolkowski Patent Solutions Group, LLC

(57) ABSTRACT

A welding apparatus having specially designed louvers that are used to cover vent openings in the enclosure and contain the components of the welding apparatus. The louvers have a common side profile and have a configuration with a rear portion that is preferably horizontal and a front portion that angles downwardly, forming a front edge. An intermediate edge is formed by the front portion and the rear portion meeting at an angle. The intermediate edge is displaced away from a straight line drawn between the front edge and the rear edge. The configuration and spacing between adjacent louvers is designed such that a standard test probe cannot be inserted through the space between any two adjacent louvers.

22 Claims, 3 Drawing Sheets

FIG. 3
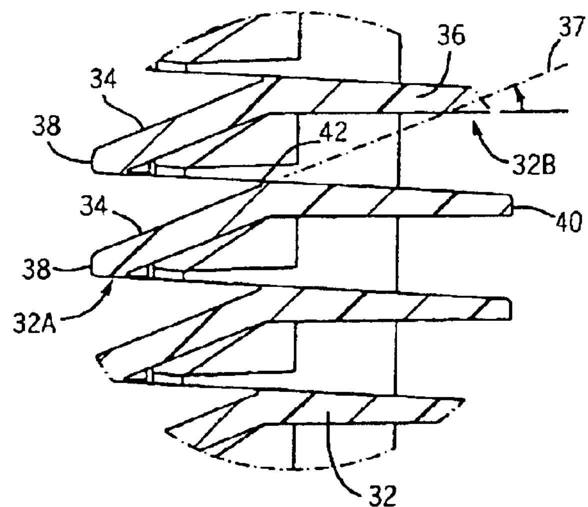
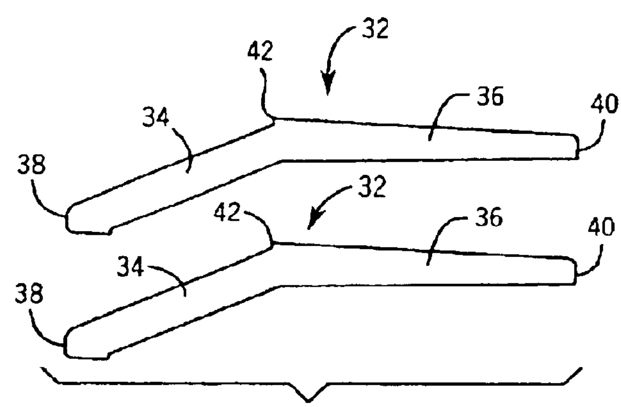
FIG. 4
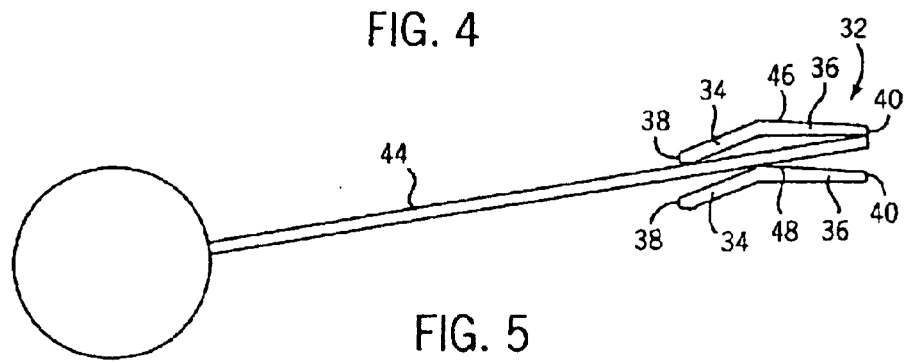
FIG. 5

LOUVER CONFIGURATION FOR WELDING APPARATUS

BACKGROUND OF INVENTION

The present invention relates generally to a welding apparatus and, more particularly, a welding apparatus having a specially configured louver assembly for a vent opening in the welding apparatus.

In the design and engineering of various types of industrial equipment, such as welding apparatus, it is conventional to provide an enclosure that surrounds and contains the components used to carry out the purpose of the apparatus to protect the operative components as well as protect persons from inadvertently coming in contact with certain of the components that can be hazardous to individuals.

The downside of such enclosures is, of course, that many of such components require cooling to maintain their temperature within certain prescribed operating limits and there is, therefore, a need to provide adequate ventilation, generally forced ventilation, so that sufficient ambient air can enter the enclosure to act as a cooling medium. Accordingly, the welding apparatus normally has one or more vent openings in the enclosure to allow the ambient air to enter into the enclosure to provide that cooling function.

With welding apparatus, however, there are certain hazardous components that pose a real risk of an electrical shock if contacted by a person or if some foreign object is inserted into the interior of the enclosure to make a contact with those components. As such there must be a limit on the vent openings that are provided in the enclosure to protect such persons. Those vent openings are, therefore, governed by certain industry standards that must be followed in the construction of such apparatus to qualify for a desired rating for the apparatus.

In the welding industry, therefore, as a standard, the vent opening is required, in order to attain a certain rating, to be constructed so as to prevent a straight cylindrical probe having a diameter of about 2.5 mm from penetrating the vent opening to reach the internal area of the enclosure.

Therefore, while some vent openings of welding apparatus have conventional louvers across the vent opening, the conventional louvers also then have a wire mesh screen proximate to the louvers in order to provide a means of preventing that aforedescribed probe from passing through the louvers and into the interior of the enclosure.

Alternatively, there can be a perforated metal grill that covers the vent open of a welding apparatus; however, obviously, the perforations in such metal grill must be smaller than the aforementioned 2.5 mm probe in order to meet the rating standard for welding apparatus.

With either alternative, that is, with a wire mesh screen, or with a perforated metal grill, however, there is considerable resistance that is encountered to the passage of ambient air through the vent openings and thus, while acceptable from the standpoint of the probe test, the arrangements are not particularly desirable with respect to the free movement of ambient air through the vent openings.

Accordingly, there is a problem in that there needs to be some optimization to allow the ambient air into the enclosure through the vent opening while, at the same time, prevent the standard probe from entering through the vent opening and into the enclosure to touch the internal components of the apparatus.

Therefore, it would be advantageous to have a louver configuration that could be usable within the vent opening of a welding apparatus that would prevent the standard probe from passing through the louver configuration while allowing sufficient ambient air to enter the enclosure to cool the components within the enclosure.

SUMMARY OF INVENTION

The present invention is directed to an improved louver configuration for a vent opening of an assembled apparatus, preferable a welding apparatus.

In the preferred embodiment, and as will be specifically described herein, the welding apparatus comprises an enclosure that contains the various components needed to provide a selectively variable current to carry out the welding process. The enclosure has a vent opening therein to allow ambient air to circulate though the enclosure.

In such apparatus, there is normally an enclosure with end panels. That is, there is a front panel and a rear panel to allow the circulation of ambient air through the enclosure. In the present invention, the specially configured louvers are provided in the rear panel to prevent intrusion to an area in the enclosure where the primary power is near. Accordingly, there is formed a plurality of louvers in the rear panel that span the vent opening, are parallel to each other, and have the same configuration. The louvers are formed such that adjacent louvers are closely spaced apart and basically have the same side profile so that each of the louvers is aligned with each other louver.

Basically, each louver is specially constructed and has a front portion that is generally planar and has a front edge that faces outwardly with respect to the interior of the welding apparatus. There is also a rear portion that is also planar and which extends toward the interior of the enclosure ending in a rear edge facing inwardly toward the interior of the welding apparatus and is preferably oriented in a plane that is generally horizontal. The rear portion and the front portion intersect at an angle to form an intermediate edge.

With the aforedescribed configuration, the front edge of the louvers extends outwardly with respect to the interior of the enclosure and therefore repels liquids that hit the front area of the enclosure since the front portion of each louver is angled downwardly in the direction away from the interior of the enclosure. As such, the liquid runs downwardly such that the liquid does not enter into the interior of the enclosure. On the other hand, the rear portions are oriented so as to be generally horizontal so that the air entering through the vent opening is less turbulent as it enters the interior of the enclosure and therefore the cooling effect is more efficient.

In all, with the present configuration of louvers, the spacing between adjacent louvers not only enhances the flow of air, but reduces the problem of dirt and debris clogging the openings between the louvers.

Various other features, objects and advantages of the present invention will be made apparent from the following detailed description and the drawings.

BRIEF DESCRIPTION OF DRAWINGS

The drawings illustrate one preferred embodiment presently contemplated for carrying out the invention.

In the drawings:

FIG. 3 is an enlarged cross sectional view of louvers constructed in accordance with the present invention;

FIG. 4 is an enlarged cross sectional view of adjacent louvers of the invention; and FIG. 5 is a schematic view of the louvers of the invention and showing a standard probe test of the louvers.

DETAILED DESCRIPTION

Figure 1:
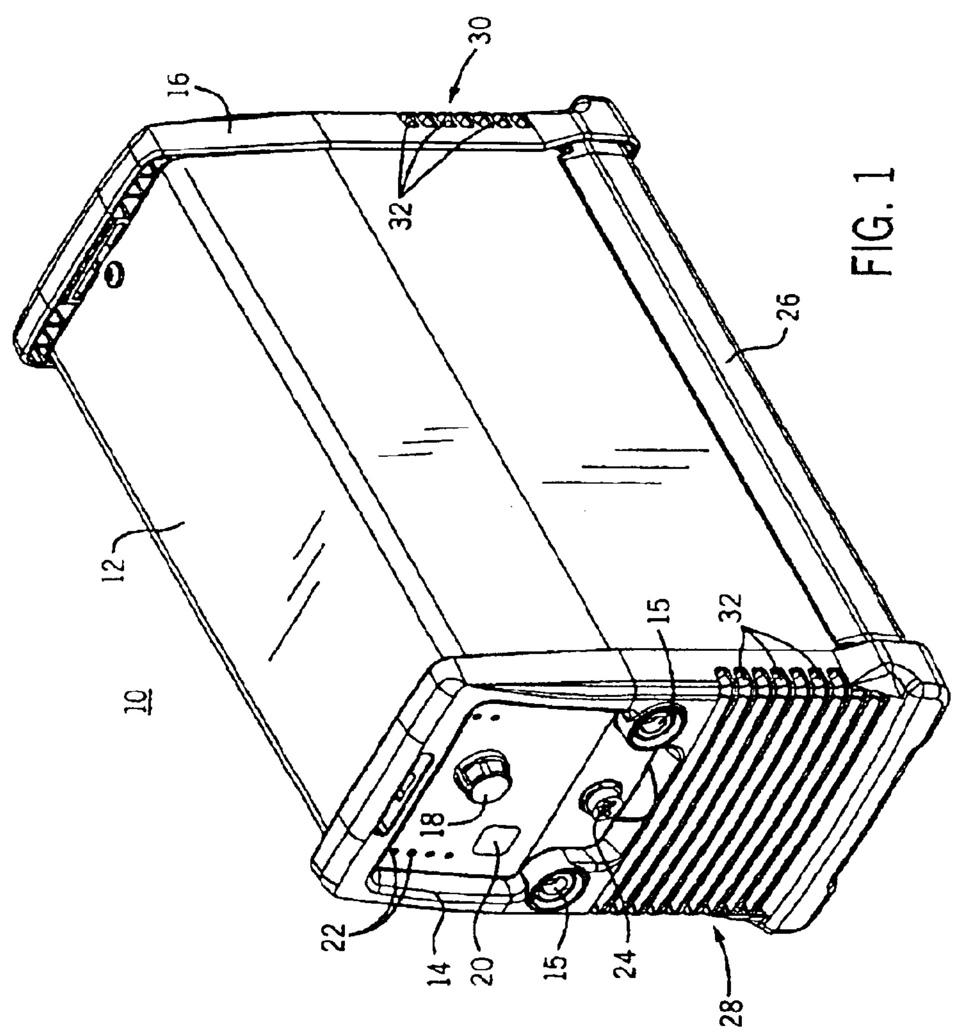
FIG. 1 is a perspective view of a welding apparatus for which the present invention is applicable.

Referring now to FIG. 1, there is shown a welding apparatus 10 that utilizes the present invention. As can be seen, the welding apparatus 10 comprises an enclosure 12 that is of sheet metal construction, preferable of aluminum, and having a front panel 14 and a rear panel 16. Both the front and rear panels 14, 16 are preferably constructed of a molded plastic material. The front panel 14 has a central control section and which includes the various controls for the welding functions and can include female connectors 15 that are used to connect the welding cables.

A control knob 18 is provided in order to control the current to the welding electrodes and a selector button 20 is provided to enable the welding apparatus to be switched between TIG and stick operations. There may also be a series of LED's 22 to provide an indication of status of the welding apparatus and to provide information as to its operation. A remote connector plug 24 is also used for the operation of remote controls such as a foot operated switch for the welding apparatus 10.

A base 26 is located underneath the enclosure 12 and can also be of molded plastic construction and, as can be seen, the base 26 can actually be elevated with respect to the floor such that the welding apparatus 10 contacts the floor through the front and rear panels 14, 16.

As also can be seen, there is a vent opening 28 formed in the front panel 14 of the enclosure 12 and a similar vent opening 30 formed in the rear panel 16 of the enclosure 12. Within each of the vent openings 28, 30, there are formed a plurality of louvers 32 in order to allow ambient air to circulate between the vent openings 28, 30 to cool the various components contained within the enclosure 12. Normally, the air flow through the enclosure 12 is carried out with the use of a forced air circulation device such as a fan (not shown).

The louvers 32 can be similar in both the front panel 14 and rear panel 16, and, therefore, the construction and configuration of the louvers 32 in the rear panel 16 will be described for purposes of explaining the present invention. However, because the rear panel 16 conceals the primary contacts and leads, it is not necessarily necessary to include louvers in accordance with the present invention in both panels 14, 16. Preferably, only the rear panel 16 requires the specially constructed louvers. However, it may be found to be more economical to construct both louvers the same.

Figure 2:
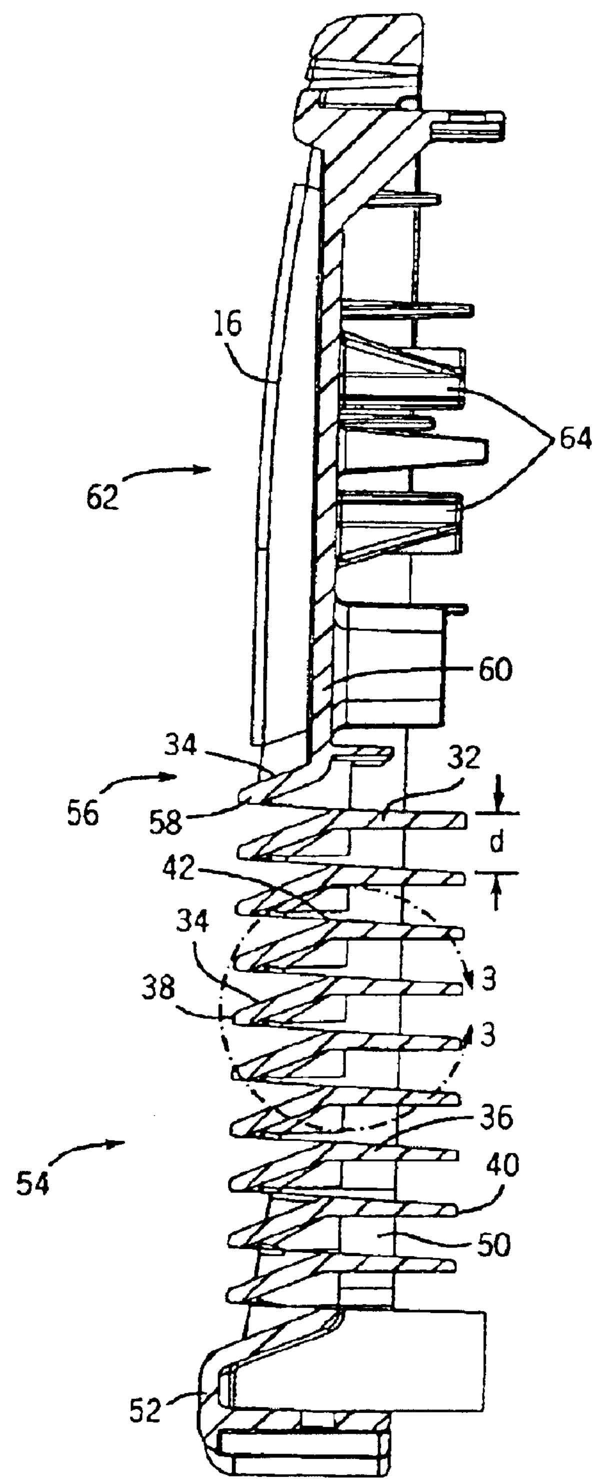
FIG. 2 is a side cross-sectional view of the rear panel of the welding apparatus of FIG. 1.

Turning then to FIG. 2, taken along with FIG. 1, there is shown a cross sectional view of the rear panel 16 and illustrating the louvers 32 of the invention. The louvers 32 are formed in the rear panel 16 such that they are in a side by side parallel relationship, that is, the side profile of each louver 32 is the same as the side profile of an adjacent louver 32 and the louvers 32 are spaced apart a distance “d” as shown in FIG. 2.

Each louver 32 has a front portion 34 and a rear portion 36. The front portion 34 has a front edge 38 that faces away from the interior of the enclosure 10 and the rear portion 36 has a rear edge 40 that faces toward the interior of the enclosure 12. The front and rear portions 34, 36 meet at an angle to each other to form an intermediate edge 42 that is displaced or offset a predetermined distance away from a straight line drawn between the front edge 38 and the rear edge 40.

Turning to FIG. 3, along with FIGS. 1 and 2, there is shown an enlarged cross sectional view of the louvers 32 of the present invention illustrating the configuration and geometry of the front portion 34 and the rear portion 36. As can be seen, the rear portion 36 of a louver 32 is preferably in a generally horizontal plane, and the front portion is angled downwardly with respect to the horizontal plane. This arrangement allows air to enter the enclosure more linearly, thereby creating less turbulence and providing more efficient cooling. Additionally, the louvers are tapered front to back from the intermediate edge 42 to the back edge 40.

The aforementioned arrangement prevents intrusion of articles of a certain size. The orientation of the louver arrangement can be described by a line 37 extending along the front portion 34 from the front edge 38 to the intermediate edge 42 of a first louver 32A that continues to extend to and intersect with the rear edge 40 of a rear portion 36 of a louver 32B immediate above the first louver 32A.

Also, since the front portion 34 is angled downwardly and faces outwardly from the interior of the enclosure 12, any moisture that lands or collects on the louvers 32 will drain downwardly and away for the interior of the enclosure 12. Further, with the rear portion 36 oriented in a generally horizontal plane, the air that passes through the louvers 32 inwardly to the interior of the enclosure 12 enters the interior linearly, thereby having less turbulence and thus creating more efficient cooling.

In FIG. 4, there is shown a side cross-sectional view of two adjacent louvers 32 and illustrating the configuration and orientation of each louver 32, which is typical of the louvers 32 of the enclosure 12 (FIG. 1). In FIG. 4, the side profile of the louvers 32 can be seen and that side profile is the same for adjacent louvers 32. The intermediate edge 42 can be seen to be offset or displaced outwardly from a straight line passing between the front edge 38 and the rear edge 40. Again the preferred orientation is with the rear portion 36 in a generally horizontal plane with the front portion 34 angled downwardly with respect to a horizontal plane in the direction facing outwardly from the interior of the enclosure 12 (FIG. 1).

Turning finally to FIG. 5, there is shown a schematic view of adjacent louvers 32 of the present invention and with a probe 44 that is in a position to attempt to pass the probe 44 between adjacent louvers 32. The probe 44 is a standard designated probe that is used for a safety rating test for welding apparatus. The diameter of the cylindrical probe is 2.5 mm. The test applies to any adjacent louvers 32. For example, the louvers 32 in FIG. 5 will be referred to as an upper louver 46 and a lower louver 48. The standards basically require that the probe 44 be prevented from passing though the louvers 32 so that an end of the probe 44 cannot reach the interior of the welding apparatus.

Thus, as can be seen in FIG. 5, the louvers 32 are configured and spaced apart such that an attempt to introduce the probe 44 through the space between the upper and lower louvers 46, 48 results in the probe 44 encountering the front edge 38 of the upper louver 46 and the intermediate edge 42 of the lower louver 48 such that the path or angle of the probe 44 is determined by those edges. Further introduction of the probe 44 results in the probe 44 encountering the rear edge 40 of the upper louver 46. The probe 44, is therefore prevented by that rear edge 40 from passing further into the interior of the enclosure 12 (FIG. 1) and thereby satisfies the rating test.

Accordingly, by the configuration and spacing apart of the louvers 32, considerable air can pass through the space between the louvers 32 into and out of the enclosure for cooling. However, the safety rating can still be maintained with the present louvers since the probe 44 cannot pass through adjacent louvers 32.

Referring back to FIG. 2, additional features of the rear panel 16 will now be described. It is understood however that these features can equally be applicable to the front panel 14 as well. The set of louvers 32 are connected to one another through a single center post 50 and is constructed to form a one-piece assembly 52 wherein a lower half 54 of the assembly 52 includes the series of louvers 32 that terminate at a midpoint 56 of the assembly 52. An uppermost louver 58 is formed without a horizontal rear portion, and is constructed such that the front portion 34 of the uppermost louver 58 is connected to a vertically extending member 60 that forms an upper half 62 of the one-piece assembly 52 to form the rear panel 16 of the welder 10. The vertically extending member 60 of the uppermost louver 58 includes mounting bosses 64 extending therefrom for attachment of the one-piece assembly 52 to the enclosure 12 of the welder 10.

As one skilled in the art will fully appreciate, the aforementioned description of welding devices not only includes welders, but also includes any system that requires high power outputs, such as heating and cutting systems. Therefore, the present invention is equivalently applicable with any device requiring high power output, including welders, plasma cutters, induction heaters, and the like. Reference to welding power, welding-type power, or welders generally, includes welding, cutting, or heating power. Description of a welding apparatus illustrates just one embodiment in which the present invention may be implemented. The present invention is equivalently applicable with many high power systems, such as cutting and induction heating systems, or any similar systems.

The present invention has been described in terms of the preferred embodiment, and it is recognized that equivalents, alternatives, and modifications, aside from those expressly stated, are possible and within the scope of the appending claims.

What is claimed is:

1. A louver assembly, said assembly comprising an enclosure, a plurality of louvers formed in the enclosure and positioned parallel to each other, the plurality of louvers having substantially the same configuration, each of the louvers having a front edge on a front portion, a rear edge on a rear portion, and an intermediate edge located between the front edge and the rear edge, adjacent louvers being spaced apart from each other such that a line extending along the front portion from the front edge to the intermediate edge of a lower louver extends to and intersects the rear edge of an upper louver and the intermediate edge of a first louver is displaced outwardly from a line extending between the front edge and the rear edge of an adjacent louver.

2. The louver assembly as defined in claim 1 wherein each of the plurality of louvers comprise a front portion and a rear portion that meet at an angle defining the intermediate edge.

3. The louver assembly as defined in claim 1 wherein the rear portion of each of the louvers is oriented in a generally horizontal plane.

4. The louver assembly of claim 3 wherein the front portion of each of the louvers is in a plane angled downwardly in the direction toward the front edge.

5. A welding apparatus comprising an enclosure having a front panel and a rear panel and a base to enclose therein an interior area to contain components for the welding apparatus, a louver assembly formed in at least the rear panel, the louver assembly comprising a plurality of louvers positioned side by side parallel to each other, the louvers having substantially the same cross-sectional profile, each of the louvers having a front edge, a rear edge and an intermediate edge located between the front edge and the rear edge, wherein a front portion of each louver has a generally uniform cross-section that inclines from the front edge to the intermediate edge and a rear portion of each louver has a cross-section generally horizontal to the welding apparatus and tapered from the intermediate edge to the rear edge, adjacent louvers being spaced apart from each other to prevent a probe of predetermined diameter from passing the rear edge of any one of the louvers.

6. The welding apparatus as defined in claim 5 wherein front portion and the rear portion of each of the plurality of louvers meet together at an angle to form the intermediate edge.

7. The welding apparatus ma defined in claim 5 wherein the louver assembly is formed in both the front and rear panels.

8. The welding apparatus as defined in claim 6 wherein the rear portion of each of the louvers is generally longer than the front portion.

9. The welding apparatus as defined in claim 8 wherein the front portion or each of the louvers is in a plane angled downwardly in the direction toward the front edge.

10. The welding apparatus as defined in claim 5 wherein the probe is a straight cylindrical probe and has a predetermined diameter of 2.5 mm.

11. A vent assembly to provide air flow into an enclosed heat generating apparatus comprising a series of louvers each louver having a front non-tapered portion with a front edge and a rear tapered portion with a rear edge separated by an intermediate edge, the front portion being at an angle to the rear portion with the intermediate edge being a point of deflection, each louver having a substantially identical cross-section and arranged such that an object having a predetermined width inserted between two louvers cannot pass past the rear portion of any louver.

12. The vent assembly of claim 11 wherein the rear tapered portion of each louver is arranged generally horizontally and the front non-tapered portion is arranged downwardly from the intermediate edge.

13. The vent assembly of claim 11 incorporated into a welder having two sets of louvers, one set positioned on an air intake and one set positioned on an air discharge, the welder constructed without screening on either the air intake or the air discharge.

14. The vent assembly of claim 11 wherein the louvers are arranged such that a plane defined by the front non-tapered portion of a first louver intersects the rear tapered portion of a louver above the first louver.

15. The vent assembly of claim 13 wherein the set of louvers are connected to one another through a single center post.

16. The vent assembly of claim 13 wherein the set of louvers is constructed of a one-piece assembly wherein a lower half of the assembly includes the series of louvers terminating at a midpoint of the assembly.

17. The vent assembly of claim 16 wherein uppermost louver is formed without a horizontal rear portion, and is constructed such that the front portion is connected to a vertically extending member that forms an upper half of the one-piece assembly to form front and rear panels of the welder.

18. The vent assembly of claim 17 wherein the vertically extending member of the uppermost louver includes mounting bosses extending therefrom for attachment of the one-piece assembly to the welder.

19. A vent assembly to provide air flow into an enclosed heat generating apparatus comprising:

a series of louvers, each louver having a front portion and a rear portion separated by an intermediate edge, the front portion being at an angle to the rear portion with the intermediate edge being a point of deflection, each louver having a substaintially identical cross-section and arranged such that an object having a predetermined width inserted between two louvers cannot pass past the rear portion of any louver while maintaining a line of sight through the series of louvers between adjacent louvers;

a welder having two sets of the series of louvers, one set positioned on an air intake and one set positioned on an air discharge, the welder constructed without screening on either the air intake or the air discharge; and wherein the louvers of each set are connected to one another through a single center post.

20. A vent assembly to provide air flow into an enclosed heat generating apparatus comprising:

a series of louvers, each louver having a front portion and a rear portion separated by an intermediate edge, the front portion being at an angle to the rear portion with the intermediate edge being a point of deflection wherein the intermediate edge is displaced outwardly from a line connecting a front edge and a rear edge of an adjacent louver, each louver having a substantially identical cross-section and arranged such that an object having a predetermined width inserted between two louvers cannot pass past the rear portion of any louver;

wherein the vent assembly is incorporated into a welder having two sets of louvers, one set positioned on an air intake and one set positioned on an air discharge, the welder constructed without screening on either the air intake or the air discharge; and wherein the set of louvers is constructed of a one-piece assembly wherein a lower half of the assembly includes the series of louvers terminating at a midpoint of the assembly.

21. The vent assembly of claim 20 wherein an uppermost louver is formed without a horizontal rear portion, and is constructed such that the front portion is connected to a vertically extending member that forms an upper half of the one-piece assembly to form front and rear panels of the welder.

22. The vent assembly of 21 wherein the vertically extending member of the uppermost louver includes mounting bosses extending therefrom for attachment of the one-piece assembly to the welder.

* * * * *